United States Patent
Shimbayashi et al.

(10) Patent No.: US 7,321,515 B2
(45) Date of Patent: Jan. 22, 2008

(54) MEMORY DEVICE AND CONTROL METHOD THEREFOR

(75) Inventors: Koji Shimbayashi, Kasugai (JP); Takaaki Furuyama, Kasugai (JP); Kenji Shibata, Kasugai (JP)

(73) Assignee: Spansion LLC, Sunnyvale, CA (US)

( * ) Notice: Subject to any disclaimer, the term of this patent is extended or adjusted under 35 U.S.C. 154(b) by 106 days.

(21) Appl. No.: 11/378,444

(22) Filed: Mar. 16, 2006

(65) Prior Publication Data

US 2006/0227629 A1 Oct. 12, 2006

Related U.S. Application Data

(63) Continuation of application No. PCT/JP2005/004621, filed on Mar. 16, 2005.

(51) Int. Cl.
G11C 7/00 (2006.01)

(52) U.S. Cl. .............. 365/189.07; 365/185.2; 365/185.25; 365/203; 365/210

(58) Field of Classification Search ............. 365/185.2, 365/185.25, 189.07, 203, 210
See application file for complete search history.

(56) References Cited

U.S. PATENT DOCUMENTS

| | | | |
|---|---|---|---|
| 6,301,156 B1 | 10/2001 | Kurosaki | |
| 6,370,060 B2 * | 4/2002 | Takata et al. | 365/185.21 |
| 6,442,081 B1 | 8/2002 | Nagashima | |
| 6,862,213 B2 * | 3/2005 | Hamaguchi | 365/158 |
| 2001/0033514 A1 | 10/2001 | Takata et al. | |
| 2003/0235093 A1 | 12/2003 | Kawano | |

FOREIGN PATENT DOCUMENTS

| | | |
|---|---|---|
| EP | 1 152 427 | 11/2001 |
| JP | 6-338192 | 12/1994 |
| JP | 2000 030474 | 1/2000 |
| JP | 2000 285687 | 10/2000 |
| JP | 2001 143486 | 5/2001 |
| JP | 2001 307494 | 11/2001 |
| JP | 2001 312895 | 11/2001 |
| JP | 2003 346490 | 12/2003 |

* cited by examiner

Primary Examiner—Hoai V. Ho
(74) Attorney, Agent, or Firm—Ingrassia Fisher & Lorenz, PC

(57) ABSTRACT

An access identification circuit (4) identifies a first access operation or a second access operation and outputs an identification signal S. During the first access operation, stored data is read out after detecting a column address CADD, a burst address, and updating a word line to newly select memory cells MC. In the second access operation, the memory cells MC connected to the common word line which has been selected are selected by sequentially switching column selector switches. Operating condition information Dx (DAx and/or DBx) used for setting a load condition in a dummy load circuit (5) and/or setting a pulse width for an equalize signal EQ in an amplification control circuit (6) is stored in each of first and second storage sections (1, 2) that are provided for the first and second access operations, respectively. The operating condition information Dx is selected by a selector circuit (3) in response to the identification signal S and fed to the dummy load circuit (5) and/or the amplification control circuit (6). A suitable operating condition is selected for each of the access operations.

20 Claims, 7 Drawing Sheets

US 7,321,515 B2

MEMORY DEVICE AND CONTROL METHOD THEREFOR

CROSS-REFERENCE TO RELATED APPLICATIONS

This is a continuation of International Application No. PCT/JP2005/004621, filed Mar. 16, 2005 which was not published in English under PCT Article 21(2).

TECHNICAL FIELD

The present invention relates to a memory device and a control method therefor, and more particularly relates to a memory device performing a continuous readout operation including a first data readout operation including selection of memory cells as a readout target and a second data readout operation wherein data is readout from memory cells which have already been selected.

BACKGROUND

Background Art

In a reference amplifier (as shown in FIG. 9) of a semiconductor memory device disclosed in Japanese Unexamined Published Patent Application No. 2001-312895 ("Patent Document 1"), during serial access operations, an L-level control signal (RCL) is provided to the input terminal of an inverter 206 so that a Pch-type MOS transistor 203 enters a shut-off state and the reference amplifier operates as a ratio circuit in accordance with the functioning of a Pch-type MOS transistor 201 and an Nch-type MOS transistor 204.

During latency, an H-level control signal (RCL) is input to the input terminal of the inverter 206 so that the Pch-type MOS transistor 203 enters a conductive state (i.e., becomes conductive), and the reference amplifier operates as a ratio circuit in accordance with the functioning of Pch-type MOS transistors 201 to 203 and the Nch-type MOS transistor 204.

Thus, a reference signal (REF) is at a high level during latency and is at a low level during the serial access operation. Since the level of the reference signal is high during the latency, a comparison between a sense level that drops as a word line rises and the level of a reference signal is performed at an early stage. In addition, since the level of the reference signal is low during the serial access operation, a comparison between a sense level that increases during precharging and the level of the reference signal is also performed at an early stage. In this way, the speed of data detection is increased.

Problem the Invention Solves

Patent Document 1 is associated with a technique for selecting the level of a reference signal during each of a latency phase and a serial access phase to accelerate the comparison made during data detection in each phase.

However, during a period from the start of reading out a reference signal from a dummy cell (reference cell) until the level of the reference signal reaches a predetermined value, a specified period of time elapses due to the propagation time constant of a signal caused by a load in a reference data readout path such as a bit line. Also, during while precharging a data readout path and the reference data readout path prior to readout of data, a specified period of time elapses before a predetermined precharge level is reached due to the propagation time constants of signals caused by loads in these paths. These propagation time constants are believed to fluctuate or vary, owing to various fluctuation factors such as diverse operating conditions and production variations.

Data detection by a sense amplifier circuit should be performed after readout data and readout reference data have reached a satisfactory level. To reliably read out data in spite of fluctuations in the propagation time constants, the detection of the data has to be performed after sufficient time has elapsed from readout of the data and reference data started, taking into account fluctuation and variation factors. This may act as a disincentive to high-speed readout access operations and is therefore disadvantageous.

SUMMARY OF THE INVENTION

Means of Solving the Problems

The present invention has been made in consideration of the above background art and a primary object of the invention is therefore to provide a memory device and a control method therefor, wherein a memory device is capable of performing high-speed access operations by individually setting an access operating condition for each of a first access operation and a second access operation when performing a continuous readout operation that includes the first access operation in which a data readout operation including selection of memory cells as a readout target is performed and the second access operation in which data is read out from the memory cells which have already been selected.

A memory device in accordance with the present invention and attempting to achieve the objects stated above performs a first access operation for performing data read out including selection of at least one memory cell as a read out target and a second access operation for performing data read out which continuously reads data from the at least one memory cell which has already been selected in the first access operation, the memory device including a first storage section storing first load information on the load to be applied to a reference data readout path during the first access operation and a second storage section storing second load information on the load to be applied to the reference data readout path during the second access operation.

Furthermore, the memory device includes a first storage section storing first precharge time information corresponding to a precharge time for a data readout path and a reference data readout path during the first access operation and a second storage section storing second precharge time information corresponding to a precharge time for the data readout path and the reference data readout path during the second access operation.

In a memory device in accordance with the present invention, when performing the continuous readout operation including the first access operation and the second access operation subsequent to the first access operation, the first storage section stores first load information on a load to be applied to the reference data readout path during the first access operation and the second storage section stores second load information on a load to be applied to the reference data readout path during the second access operation. Alternatively, the first storage section stores first precharge time information indicating a precharge time for the data readout path and the reference data readout path during the first access operation, whereas the second storage section stores second precharge time information indicating a precharge time for the data readout path and the reference data readout path during the second access operation.

A control method for a memory device in accordance with the present invention performs a continuous readout operation including a first access operation for performing a data readout operation including selecting memory cell(s) as a readout target and a second access operation for performing data readout operations to continuously read data from the memory cell(s) which have already been selected in the first access operation. The method includes the steps of, in the first access operation, setting a load to be applied to a reference data readout path based on first load information stored in the memory device and, in the second access operation, setting a load to be applied to the reference data readout path based on second load information stored in the memory device.

The control method for a memory device in accordance with the present invention further comprises the steps of, in the first access operation, setting a precharge time for a data readout path and a reference data readout path based on first precharge time information stored in the memory device and, in the second access operation, setting a precharge time for the data readout path and the reference data readout path based on second precharge information stored in the memory device.

In accordance with the control method for the memory device in accordance with the present invention, when performing the continuous readout operation including the first access operation and the second access operation subsequent to the first access operation, a load to be applied to the reference readout path is set based on first load information stored in the memory device during the first access operation and a load to be applied to the reference readout path is set based on second load information stored in the memory device during the second access operation. During the first access operation, a precharge time for the data readout path and the reference data readout path is set based on the first precharge time information stored in the memory device. During the second access operation, a precharge time for the data readout path and the reference data readout path is set based on the second precharge time information stored in the memory device.

Effect of The Invention

With the above arrangement, during each of the first and second access operations, when reading out data from memory cells through the data readout path, the load to be applied to the reference data readout path can be adjusted in accordance with variations in the propagation time constant of the data caused by the load on the data readout path. Additionally, in each of the first and second access operations, a precharge time for the data readout path and the reference data readout path can be arbitrarily set during a precharge operation prior to readout of data.

If the propagation time constant of data read out during the first access operation in which data readout operations including selection of memory cells is performed and the propagation time constant of data read out during the second access operation in which data is read out from the selected memory cells are different from each other and/or respectively vary, or if the characteristics of the memory cells and the reference cell vary, the propagation time constant of data and the precharge time for the reference data readout path can be adjusted for each of the first and second access operations. Irrespective of the first or second access operation, a level change in readout operations in the data readout path balances with a level change in readout operations in the reference data readout path. Since the difference in level between these paths reaches a specified level at a time earlier than the start of readout, the access operation can be accelerated.

In accordance with the present invention, there is provided a memory device capable of performing high-speed access operations and a control method therefor. In the memory device, when performing a continuous readout operation that includes the first access operation in which a data readout operation including selection of memory cells as a readout target is performed and the second access operation in which data is readout from the memory cells which have already been selected, an adjustment is made to the first and second access operations, respectively, in terms of the load on the reference data readout path and the precharge time of the data readout path, so that a level change in the data readout path is made to balance with a level change in the reference data readout path during readout of data, thereby enabling a high-speed access operation.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

Referring now to FIGS. 1 to 8 of the accompanying drawings, a memory device and a control method therefor will be hereinafter described in detail in accordance with an illustrative embodiment of the present invention.

Figure 1:
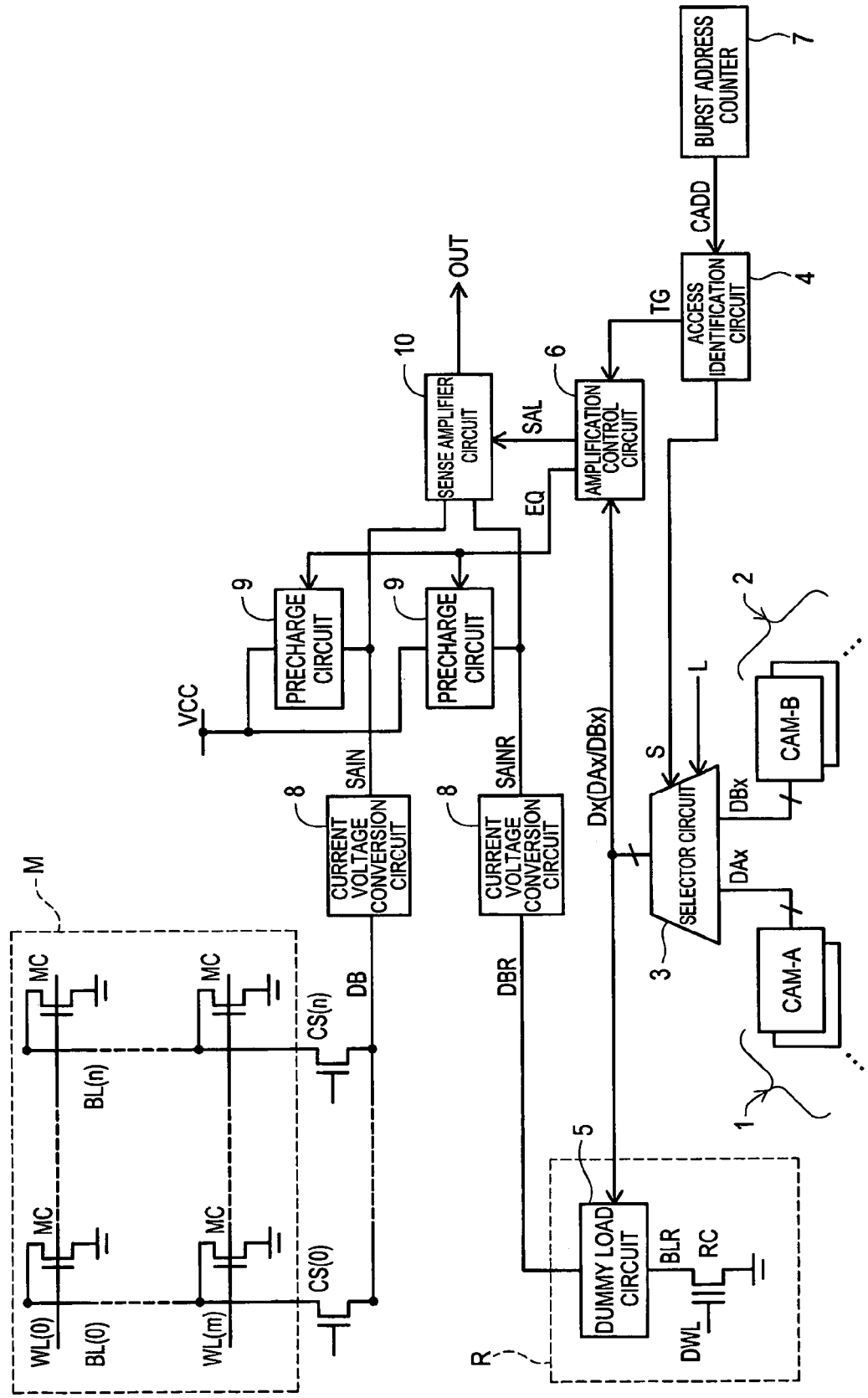
FIG. 1 is a circuit block diagram of a memory device in accordance with an illustrative embodiment.

FIG. 1 is a circuit block diagram showing the data readout control section of a nonvolatile memory device in accordance with an illustrative embodiment of the present invention. Memory cells MC are placed, in matrix form, at the intersections of word lines WL(0) to WL(m) and bit lines BL(0) to BL(n), thereby forming a memory cell array M. The bit lines BL(0) to BL(n) are connected to a data line DB through column selector switches CS(0) to CS(n), respectively. Connected to the data line DB is a current voltage conversion circuit 8 that is in turn connected to one input terminal of a sense amplifier circuit 10 through a data input line SAIN. A precharge circuit 9 is connected to the data input line SAIN, so that the precharge circuit 9 precharges the data input line SAIN to a supply voltage VCC, while precharging the data line DB and the bit lines BL(0) to BL(n) to a voltage level stepped down through the current voltage conversion circuit 8.

The stored data of memory cells selected by the word lines WL(0) to WL(m) and the column selector switches CS(0) to CS(n) are read out through a data readout path that extends from the bit lines BL(0) to BL(n) to the data line DB through the column selector switches CS(0) to CS(n). In the case of a nonvolatile memory device, stored data is, for example, in the form of a threshold voltage of the memory cells MC. It is determined whether the memory cells MC selected in accordance with the stored data are conductive or non-conductive. If the memory cells MC are conductive, the data readout path precharged by the precharge circuit 9 prior to the readout operation is discharged. At that time, the data current flowing through the data readout path is converted into the voltage value in the current voltage conversion circuit 8 and output on the data input line SAIN.

A reference section R is provided with a reference cell RC to be selected by a dummy word line DWL. The logic level of the stored data which is read out is determined by reference to data stored in the reference cell RC.

The reference cell RC is connected to a reference data line DBR through a reference bit line BLR and a dummy load circuit 5. Connected to the reference data line DBR is a current voltage conversion circuit 8 that converts a reference current flowing in a reference data readout path into a voltage value, the reference data readout path including the dummy load circuit 5 and the reference data line DBR. The current voltage conversion circuit 8 is connected to the other input terminal of the sense amplifier circuit 10 through a reference data input line SAINR. The reference data input line SAINR is connected to a precharge circuit 9 similar to the data input line SAIN, so that the precharge circuit 9 precharges the reference data input line SAINR to a supply voltage VCC while precharging the reference data line DBR and the reference bit line BLR to a voltage level stepped down through the current voltage conversion circuit 8.

The first access operation differs from the second access operation in cycle time. Therefore, the dummy load circuit 5 is arranged for each operation, being constituted by a load that matches the parasitic load caused by the resistance and capacitance components of the memory cells MC and various switching elements and wiring material itself that are connected to the data readout path extending from the memory cells MC to the data line DB. The dummy load circuit 5 is formed from the same wiring material, having the same switching elements and/or is imitatively connected to resistance elements and capacitance elements such that the readout time constant of the stored data of the memory cells MC matches the readout time constant of the reference data of the reference cell RC. In addition, if the matching condition is interrupted by various fluctuation factors such as production variations, the load on the reference data readout path can be adjusted independently for each of the first and second access operations, thereby matching the time constants.

The precharge circuits 9 and the sense amplifier circuit 10 are controlled by an amplification control circuit 6. Specifically, the operation of the precharge circuits 9 for precharging the data input line SAIN and the reference data input line SAINR, the data line DB and the reference data line DBR, and the bit lines BL(0) to BL(n) and the reference bit line BLR and the operation of the sense amplifier circuit 10 for amplifying readout data are controlled by the amplification control circuit 6. The control signals output from the amplification control circuit 6 include an equalize signal EQ for controlling the precharge circuit 9 and a sense amplifier latch signal SAL for controlling the sense amplifier circuit 10.

The amplification control circuit 6 is configured to adjust the pulse time of the equalize signal EQ. The electric charges of the data readout path and the reference data readout path, which are precharged by the pulse-driven equalize signal EQ, are accumulated in the respective capacitance components of these paths. The accumulated charges are then extracted in accordance with the conductive conditions of the memory cells MC and the reference memory cell RC. Readout of data is done by amplifying the differential voltage which is caused to appear in the data input line SAIN and the reference data line SAINR by electric discharge.

The discharge current of the memory cells MC and the reference memory cell RC is dependent on the transistor characteristics of the nonvolatile transistor that constitutes the memory cells MC and the reference memory cell RC. Specifically, the larger the difference in voltage between the drain and source of the nonvolatile transistor, the larger the current driving ability thereof. Therefore, if precharging to a sufficiently high voltage level is preformed, electric discharging can be carried out with a sufficiently large current driving ability so that the differential voltage can be amplified at an early stage. In contrast with this, if the voltage level at the time of precharging is insufficient, a satisfactory current driving ability cannot be obtained and it takes a long time to obtain an amplifiable differential voltage.

Since the first access operation differs in cycle time from the second access operation, the memory device is configured such that the equalize signals EQ for these access operations can be individually adjusted so that a sufficient differential voltage can be obtained in a short time between the data input line SAIN and the reference data input line SAINR.

During a continuous readout operation such as a burst operation, an access operation is performed in response to updating an address. In a synchronous nonvolatile memory device, a burst address counter 7 updates a column address CADD in response to a clock signal (not shown). The column address CADD is input to an access identification circuit 4.

The access identification circuit 4 identifies the access operation of the continuous access operation, while detecting the address value of the column address CADD to notify the amplification control circuit 6 that address updating has been completed. An address update signal TG is provided to the amplification control circuit 6 as a trigger signal. The first access operation includes a burst operation and stored data is read out subsequently to updating a word line and selecting new memory cells MC; the second access operation identifies the memory cells MC connected to the common word line which has already been selected by sequentially switching column selector switches and, in accordance therewith, an identification signal S is output.

The address update signal TG is an address transition detection signal (ATD) that is output in the form of a pulse signal during a transition from one address to another. The identification signal S is output in response to the column address CADD. After the column address CADD is updated and the column selector switches are sequentially selected, thereby performing the second access operation, the column address CADD loops back and all the column selector switches are selected. In response to this, the word line is switched. If the column address CADD returns to a specified value, an identification signal S indicative of the first access operation is output.

A load condition to be set in the dummy load circuit 5 and/or operating condition information Dx (DAx and/or DBx) for setting a pulse width for the equalize signal EQ in the amplification control circuit 6 is stored in a first storage section 1 for the first access operation and a second storage section 2 for the second access operation. The first storage section 1 has a plurality of memory areas CAM-A and the second storage section 2 has a plurality of memory areas CAM-B, each memory area being composed of a nonvolatile memory element.

Either of the operating condition information pieces DAx or DBx, which are stored in the memory areas CAM-A of the first storage section 1 and the memory areas CAM-B of the second storage section 2, respectively, is selected by a selector circuit 3 and supplied to the dummy load circuit 5 and/or the amplification control circuit 6. The selection in the selector circuit 3 is performed by the identification signal S and also by latency information L during the burst operation.

By determining, based on the identification signal S, whether the first access operation or the second access operation is performed, the operating condition information DAx or DBx is selected from the first or second storage sections 1, 2. In addition, in a memory device capable of performing burst operations, an optimum combination of operating conditions is selected in accordance with the latency information L that is set in accordance with an operation frequency.

For instance, a k-bit-wide logic signal may be used as the operating condition information DAx or DBx, whereby $2^k$ ways of identification becomes possible. Thereby, the time constant of the reference data readout path and the pulse width of the equalize signal EQ can be adjusted in $2^k$ ways.

Figure 2:
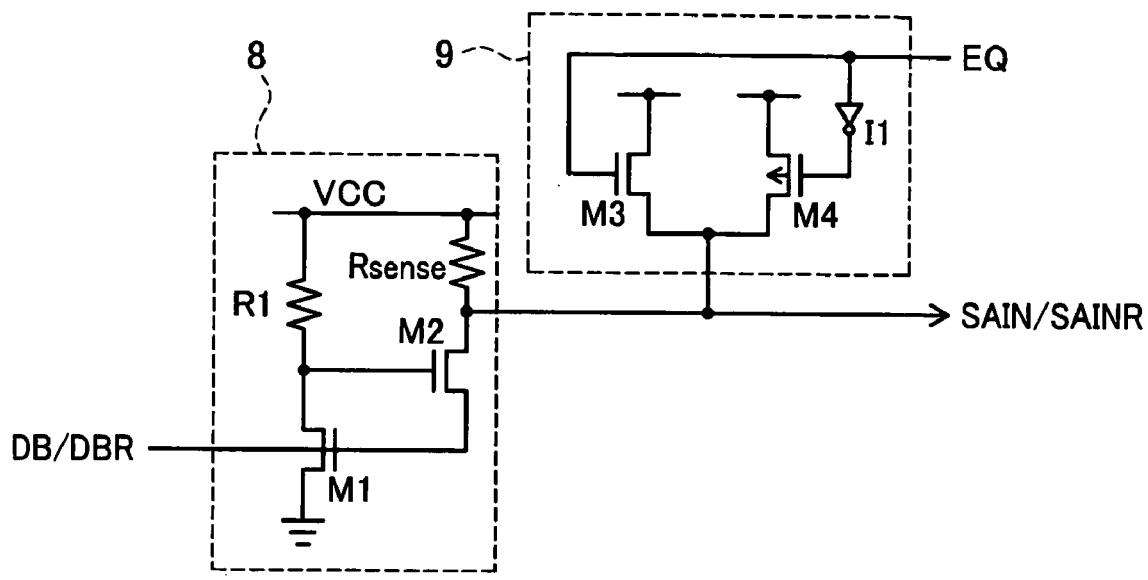
FIG. 2 is a circuit diagram showing a precharge circuit for data lines and a current voltage conversion circuit in accordance with the illustrative embodiment.

FIG. 2 shows an illustrative embodiment of the current voltage conversion circuit 8 and the precharge circuit 9 in accordance with the present invention. The data line DB and the reference data line DBR are connected to the gate terminal of an NMOS transistor M1 and the source terminal of an NMOS transistor M2. The source terminal of the transistor M1 is connected to ground potential and its drain terminal is connected to the supply voltage VCC through a resistance element R1 and to the gate terminal of the NMOS transistor M2. The drain terminal of the NMOS transistor M2 is connected to the data input line SAIN and the reference data input line SAINR, which constitute the output from the current voltage conversion circuit 8, and is connected to a resistance element (Rsense) connected to the supply voltage VCC. The data input line SAIN and the reference data input line SAINR are connected to the precharge circuit 9 that is connected between the supply voltage VCC and the lines SAIN/SAINR. The precharge circuit 9 includes an NMOS transistor M3 and a PMOS transistor M4. The equalize signal EQ is input to the gate terminal of the NMOS transistor M3. Input to the gate terminal of the PMOS transistor M4 is the equalize signal EQ inverted by an inverter gate I1. Each of the transistors M3, M4 becomes conductive upon receipt of the High-level equalize signal EQ, thereby performing the precharge operation.

Stored data read out from the memory cell array M is transferred as a current to the data input line SAIN and the reference data input line SAINR through the NMOS transistor M2. The data input line SAIN and the reference data input line SAINR need to be precharged to the supply voltage VCC prior to the current-to-voltage conversion in order that, after precharging the data input line SAIN and the reference data input line SAINR such that their voltage level becomes the supply voltage VCC, a drop in voltage is caused or is not caused depending upon the presence/absence of the current corresponding to the stored data, thereby converting the current to a voltage value.

The precharging operation is performed by conduction of the MOS transistors M3, M4 in such a way that the data line DB and the reference data line DBR are supplied with an electric charge through the NMOS transistor M2 and the bit line is supplied with an electric charge through the column selector switch while charging the data input line SAIN and the reference data input line SAINR to the supply voltage VCC.

The NMOS transistor M1 determines, in cooperation with the resistance element R1, the gate voltage of the NMOS transistor M2. Thus, since the gate terminal of the NMOS transistor M1 is connected to the data line DB and the reference data line DBR, the conductance of the NMOS transistor M1 increases in accordance with the rise of the voltage of the data line DB and the reference data line DBR. In addition, the operation of stepping-down the gate voltage of the NMOS transistor M2 is performed in a direction to restrict the rise of the voltage in order to maintain the precharge voltage level of the data line DB, the reference data line DBR and the bit line to a specified low voltage level.

The resistance element (Rsense) is connected between SAIN/SAINR and VCC and, in a stationary condition, produces the potential difference V (=current value×resistance value) corresponding to the current flowing in the memory cells MC and the reference cell RC.

Figure 3:
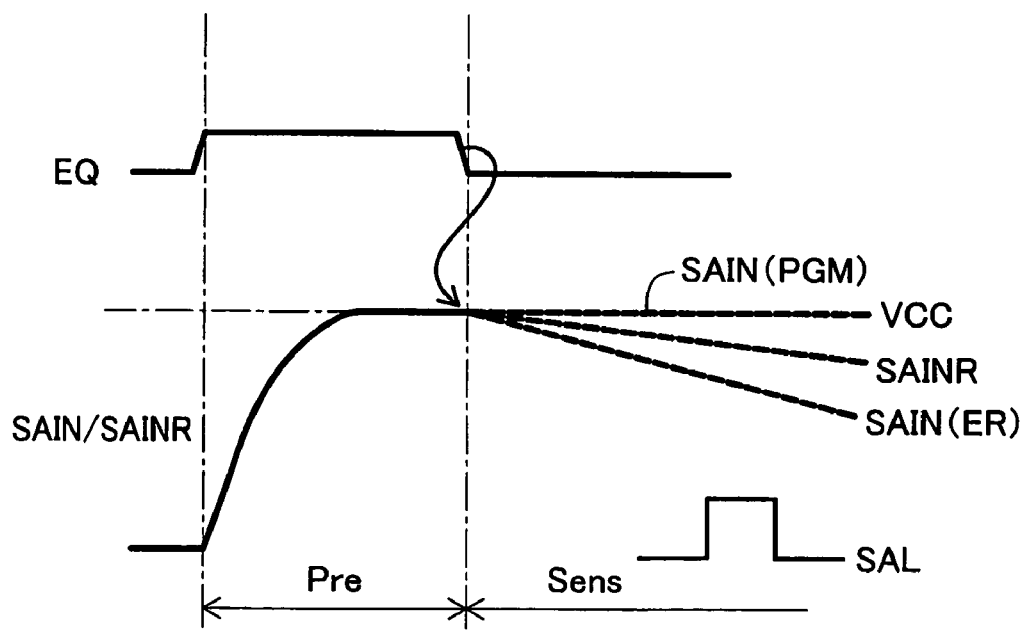
FIG. 3 is an operation waveform chart showing a period from the precharge operation of the circuit of FIG. 2 to a readout operation in accordance with the illustrative embodiment.

FIG. 3 shows a waveform of operation associated with the data input line SAIN and the reference data input line SAINR, from the precharge operation through the readout operation, in accordance with the illustrative embodiment of the present invention. The operation of reading out the stored data is composed of an amplification phase Sens for sensing stored data which has been converted into voltage and a precharge phase Pre prior to the amplification phase Sens. In the precharge phase Pre, the equalize signal EQ transitions to a high level. In response thereto, the MOS transistors M3, M4 are substantially simultaneously brought into a conductive state. The term "substantially simultaneously" used herein takes into account the time difference caused by a delay in the inverter gate I1 when the inverter gate I1 generates a signal by logically inverting the equalize signal EQ. The same is applied to cases where logic inversion circuits other than the inverter gate I1 are used.

As the precharge operation Pre starts, the MOS transistors M3, M4 concurrently start electric conduction and the voltage levels of the data input line SAIN and the reference data input line SAINR both rise as time elapses, approaching the voltage level of the supply voltage VCC. In the amplification phase Sens, the equalize signal EQ transitions to a low level, so that the MOS transistors M3, M4 substantially simultaneously become non-conductive. By making the MOS transistors M3, M4 non-conductive, the electric charge supplied by precharging is discharged through the path that leads to the memory cells MC and the reference cell RC. Whether the discharging is performed is dependent on the current driving ability of the nonvolatile transistors that constitute the memory cells MC and the reference cell RC, the current driving ability being determined by the threshold voltage of the transistors. If the memory cells MC are in their programming (PGM) state, they have a high threshold voltage so that discharge is not performed (this case is represented by Line SAIN (PGM) of FIG. 3). If the memory cells MC are in their erasing (ER) state, they have a low threshold voltage so that discharge is performed (this case corresponds to Line SAIN (ER) of FIG. 3). The threshold voltage for the reference cell is set in a state intermediate (which is represented by Line SAINR of FIG. 3) between these states PGM and ER.

By adjusting the time constant of the reference data readout circuit and the pulse width of the equalize signal EQ, the precharge levels of the data readout circuit and the reference data readout circuit can be defined close to the voltage level of the supply voltage VCC during the precharge phase Pre. In addition, during the amplification phase Sens, the voltage level of the data input line SAIN increasingly differs from the voltage level of the reference data input line SAINR in accordance with the stored data as time elapses, while maintaining the voltage level relationship between the data input line SAIN and the reference data input line SAINR (i.e., the relationship wherein SAIN is higher in voltage level than SAINR when the stored data is in a programmed state and SAIN is lower than SAINR when the stored data is in an erased state).

Figure 4:
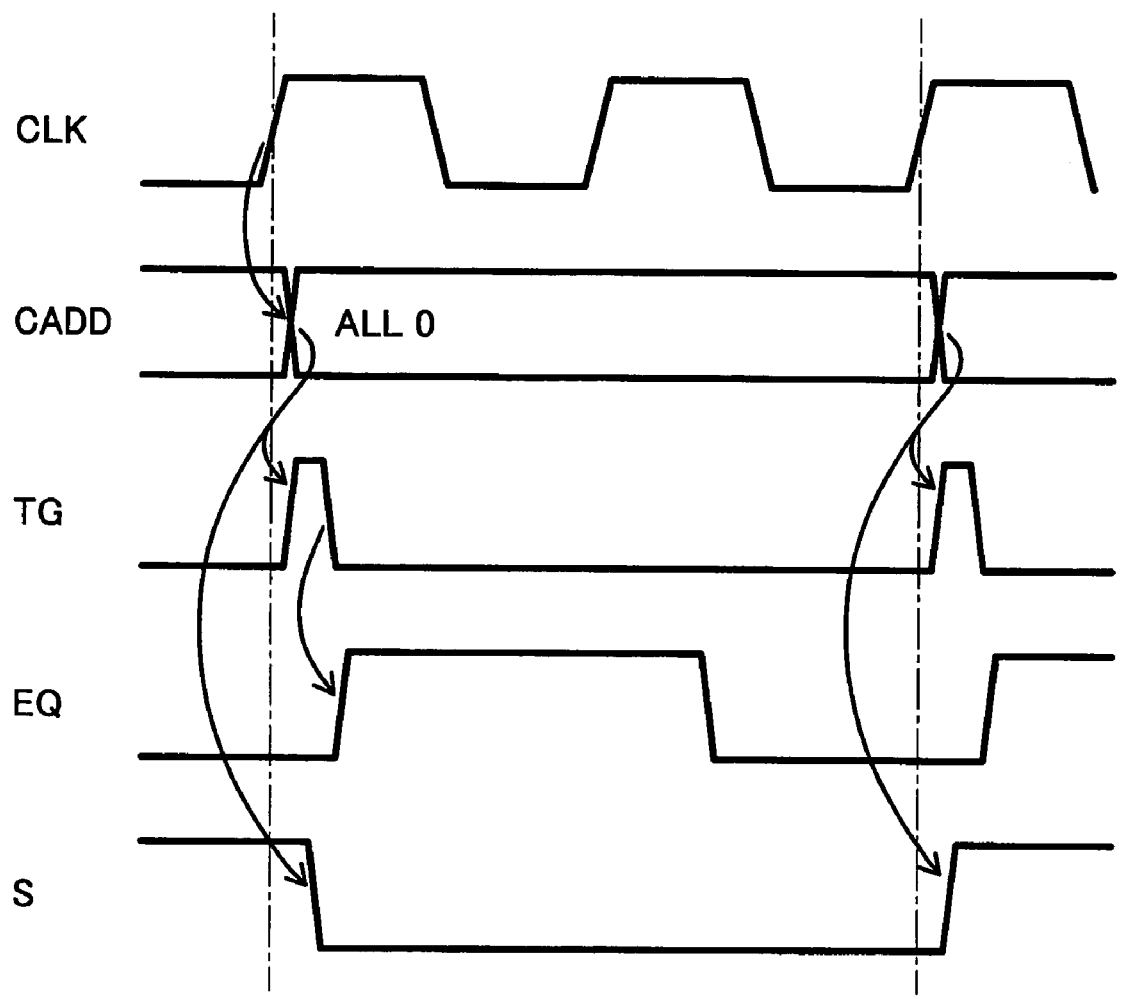
FIG. 4 is an operation waveform chart of an access operation identifying circuit in accordance with the illustrative embodiment.

FIG. 4 is a waveform chart showing the operation of the access identification circuit 4 in accordance with the embodiment of the present invention. This figure exemplifies a case in which data is read out from the memory cells MC in accordance with the timing of a two-cycle clock signal CLK in a synchronous memory device. By reading out at least two-bit data in response to every two-cycle clock signal CLK, the continuous readout operation such as a burst readout operation can be performed for every clock cycle as an external interface.

In response to the column address CADD that is switched in synchronization with a high-level transition of the clock signal CLK, the address update signal TG in the form of a high-level pulse signal is output. Meanwhile, the identification signal S is inverted to a low level in response to the switched column address CADD being at its initial level at which each bit value is at a low level. Then, the equalize signal EQ transitions to a high level in response to a low level transition of the address update signal TG, so that the precharge operation starts. It should be noted that the identification signal S transitions to a high level in response to the column address CADD being switched from its initial value during the subsequent cycles. As described later, the equalize signal EQ generates a high-level pulse having a time set by the amplification control circuit 6 to perform the precharge operation. After a low-level transition of the equalize signal EQ, an amplification operation is performed in a timing (not shown) within the sense amplifier circuit 10.

It should be understood that the initial value of the column address CADD, with which a low-level transition of the identification signal S is made, is a starting address for a series of burst operations. More specifically, a word line is switched by this starting address, thereby reinitiating the selection of memory cells MC. In the following cycle, the column selector switches are sequentially switched to select the memory cells MC connected to the common word line, thereby performing the burst operation.

Thus, the identification signal S is output prior to the precharge operation performed in response to a high-level transition of the equalize signal EQ and the time constant of the reference data readout circuit as well as the pulse width of the equalize signal EQ can be determined.

Figure 5:
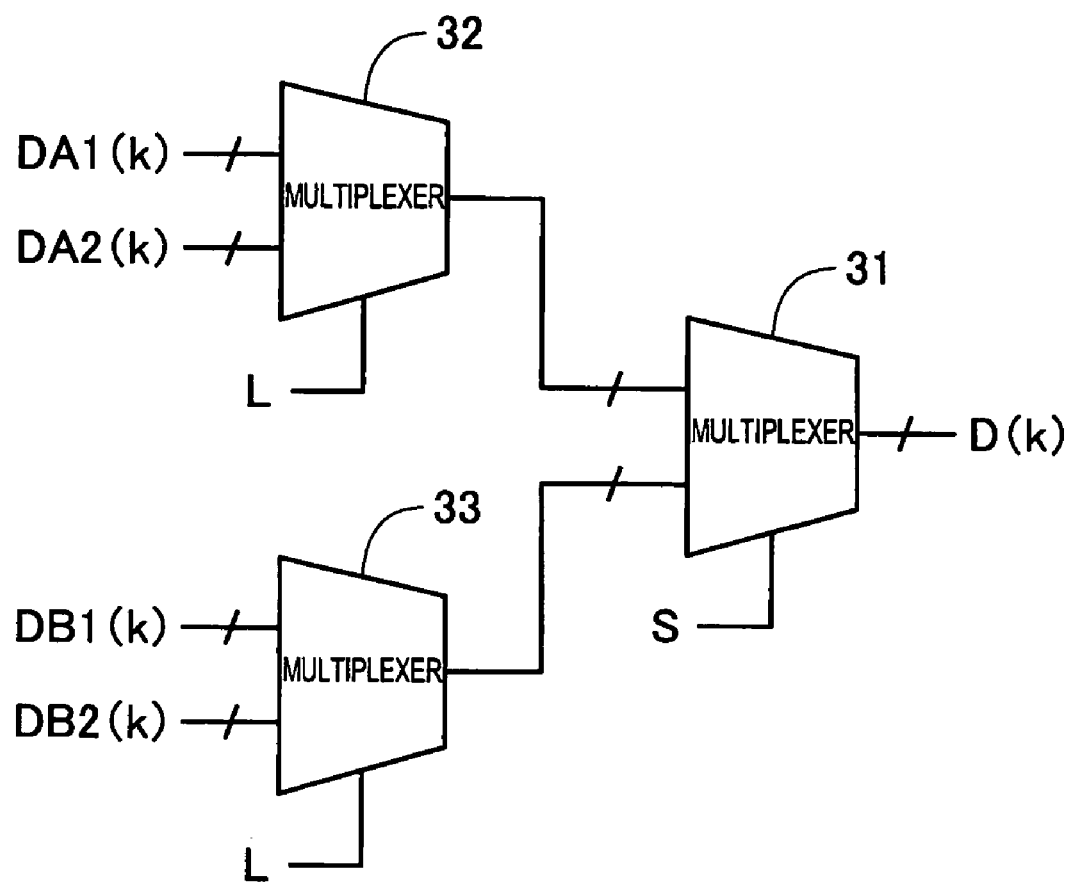
FIG. 5 is a circuit diagram showing a selector circuit for selecting an access condition in accordance with the illustrative embodiment.

FIG. 5 shows an illustrative embodiment of the selector circuit 3 in accordance with the present invention. Two elements of operating condition information DA1(k), DA2(k) and two elements of operating condition information DB1(k), DB2(k) (where k is a natural number) are stored in the first and second storage sections 1, 2, respectively. The elements of operating condition information DA1(k), DA2(k) each indicate an operating condition for the first access operation, whereas the elements of operating condition information DB1(k), DB2(k) each indicate an operating condition for the second access operation. Two elements of information are provided for each operation condition because operation conditions are stored in accordance with different oscillation frequencies for a synchronous operation. Each element of information is of k-bit width. One element is associated with the time constant of the reference data readout path whereas the other element is associated with the pulse width of the equalize signal EQ.

Thus, input to multiplexers 32, 33 are the operating condition information DA1(k), DA2(k) and DB1(k), DB2(k). In accordance with the latency information L during the burst operation, either of the operating condition information is selected for each of the multiplexers 32, 33. Herein, the latency information L during the burst operation is set in accordance with the oscillation frequency at the time of the synchronous operation because the initial latency has an inherent value in accordance with oscillation frequency.

The output terminals of the multiplexers 32, 33 are connected to the input terminal of a multiplexer 31. In response to the identification signal S, either of the multiplexers 32, 33 is selected to output the operating condition information D(k). More specifically, if the identification signal S is at a high level, the multiplexer 32 is selected and either of the operating condition information elements DA1(k), DA2(k) is selected in accordance with the latency information L and output as the operating condition information D(k). If the identification signal S is at a low level, the multiplexer 33 is selected and either of the operating condition information elements DB1(k), DB2(k) is selected in accordance with the latency information L and then output as the operating condition information D(k).

A combination of operating conditions in compliance with the oscillation frequency of the synchronous operation is selected in accordance with the latency information L, whereas the operating condition suited for the first or second accessing operation is selected from the selected combination of operating conditions in accordance with the identification signal S.

Although FIG. 5 has been explained in the context of a case where two elements of operating condition information are stored in each of the first and second storage sections 1, 2 and either of these sets is selected by the multiplexer 32 or 33, the invention is not necessarily limited to this. In accordance with an alternative embodiment, another multiplexer and/or a multiplexer having three or more selective functions may be provided and one element is selected from three or more sets of operating conditions in response to the latency information L. FIG. 5 is one example of a circuit structure for selection where the combination of operating conditions for each of the first and second access operations is determined beforehand. The invention is not necessarily limited to this but may be modified such that the operating condition for the first access operation and the second access operation is first selected by a multiplexer and, then, the first or second access operation is specified. Further, the address of an individual element of operating condition information stored in the first and second storage sections 1, 2 may be designated in place of or in addition to the use of the identification signal S, whereby operating conditions for the first and second access operations can be more freely selected.

Figure 6:
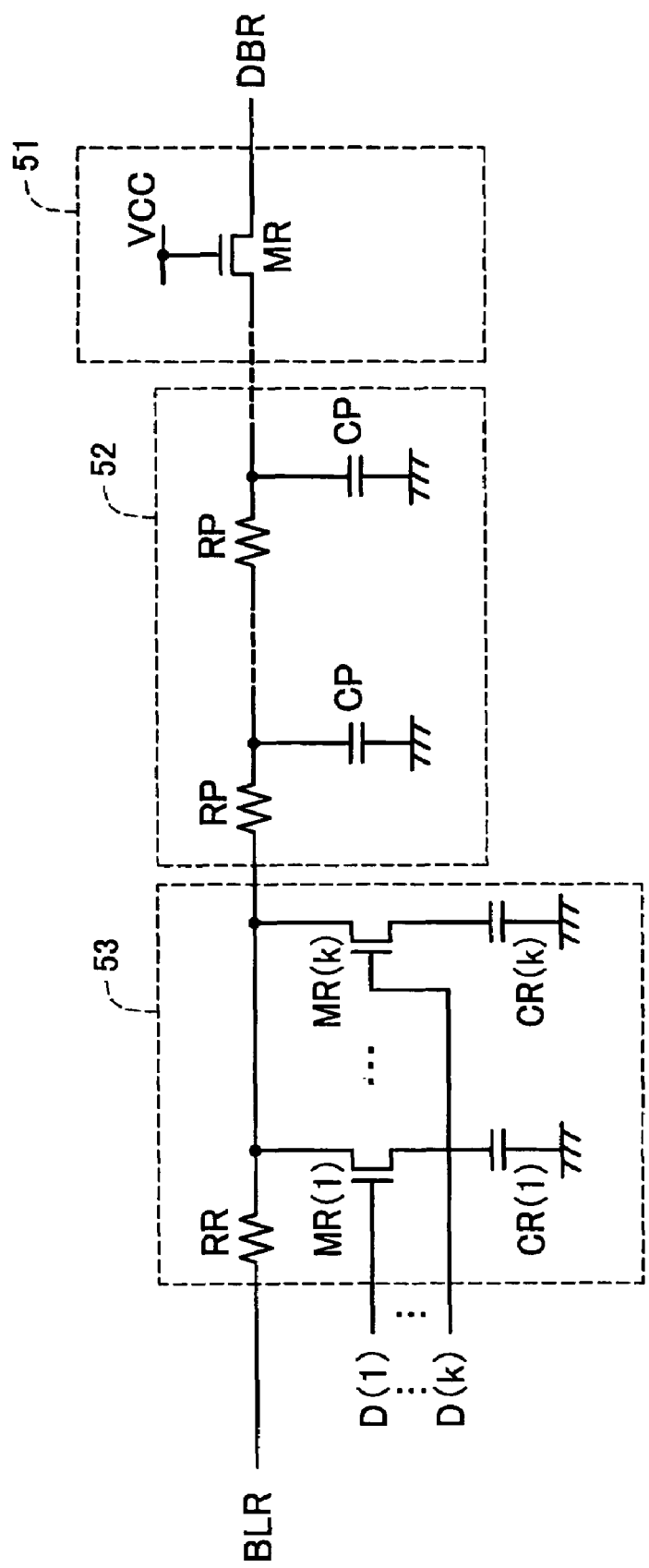
FIG. 6 is a circuit diagram showing a dummy load circuit in a readout path for a reference cell in accordance with the illustrative embodiment.

FIG. 6 shows an illustrative embodiment of the dummy load circuit 5 in accordance with the present invention. The dummy load circuit 5 is provided in the reference data readout path extending from the reference cell RC to the reference data line DBR. This circuit 5 imitatively provides a load corresponding to the wiring capacitance and wiring resistance of the data readout path that extends from the memory cells MC to the data line DB. The wiring capacitance and wiring resistance of the data readout path are due to the number of memory cells MC connected to one bit line, the various switching elements for controlling the connection of the path, and/or the load components of the wiring material itself. These components are imitatively reproduced by the following three constituent elements.

The first element is a switching element imitation section 51. A switching element MR equivalent to the various switching elements on the data readout path is inserted. By fixedly setting the gate terminal to the supply voltage VCC (in the case of an NMOS transistor) or to the ground potential (not shown) (in the case of a PMOS transistor), a conductive condition is established on a constant basis and the load components such as junction capacitance, oxidized film capacitance and/or ON-resistance are imparted to the reference data readout path.

The second element is an actual wiring section 52. This section 52 is an actual wiring part that is wired in a wiring condition (e.g., wiring material and wiring size) equivalent to that of the data readout path. A resistance component RP and a capacitance component CP are provided on a distributed constant basis to the reference data readout path by actual wiring.

The third element is a load adjusting section 53. The section 53 shown in FIG. 6 has a configuration in which capacitive components CR(1) to CR(k) are connected to a resistance component RR through NMOS transistors MR(1) to MR(k) acting as capacitive load switch elements MR(1) to MR(k). Input to the gate terminals of the NMOS transistors MR(1) to MR(k) are operating condition information D(1) to D(k). In accordance with the positions and/or combination of high-level bit signals of the operating condition information D(1) to D(k), a capacitance component and/or a combination of capacitance components connected to the reference data readout path is selected.

The load adjusting section 53 adjusts the load on the path extending from the reference bit line BLR to the reference data line. DBR and adjusts the time constant of the reference data readout path.

Figure 7:
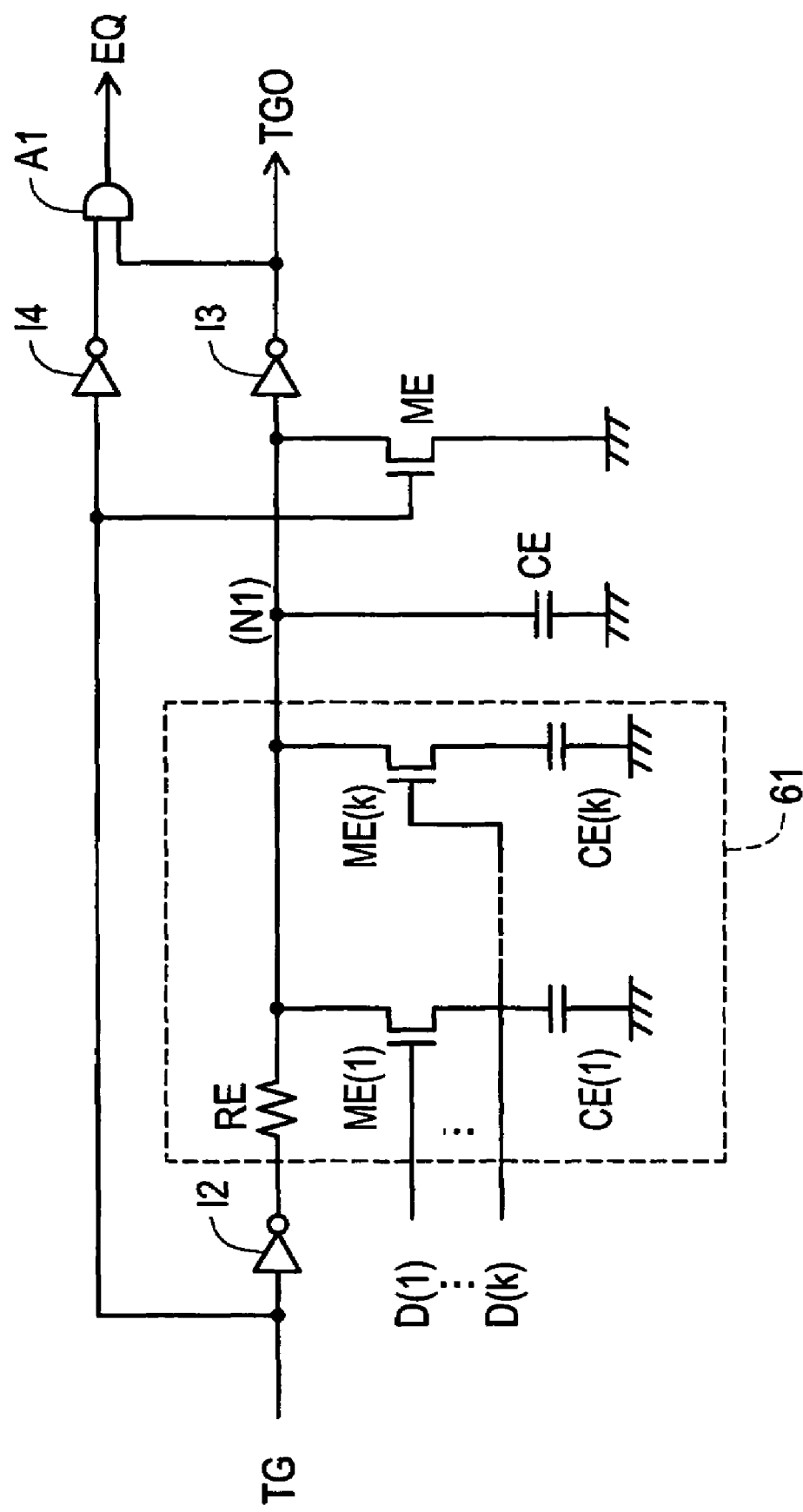
FIG. 7 is a circuit diagram showing a circuit for generating a precharge signal EQ of an amplification control circuit in accordance with the illustrative embodiment.

FIG. 7 shows an illustrative embodiment of the output part of the amplification control circuit 6 for outputting the equalize signal EQ in accordance with the present invention. The address update signal TG is input to inverter gates I2, I4 and the gate terminal of an NMOS transistor ME. The output terminal of the inverter gate I2 is connected to a timer section 61. The timer section 61 is composed of a resistance element RE, NMOS transistors ME(1) to ME(k) and capacitance elements CE(1) to CE(k).

In the timer section 61, the output terminal of the inverter gate I2 is connected to one terminal of the resistance element RE. The capacitive elements CE(1) to CE(k) are connected to the other terminal (node N1) of the resistance element RE through the NMOS transistors ME(1) to ME(k) acting as capacitive load switch elements. Input to the gate terminals of the NMOS transistors ME(1) to ME(k) are operating condition information D(1) to D(k). In accordance with the positions and/or combinations of high-level bit signals among signals indicative of the operating condition information D(1) to D(k), a capacitive element and/or a combination of capacitive elements connected to node N1 are selected.

A capacitive element CE and the NMOS transistor ME are also connected to the node N1. Further, the node N1 is connected to the input terminal of an inverter gate I3 which outputs an output signal TGO from the output terminal thereof. The output signals of the inverter gates I3 and I4 are input to an AND gate A1 which, in turn, outputs the equalize signal EQ.

The operation of the circuit shown in FIG. 7 will be described with reference to the operation waveform chart of FIG. 8. The address update signal TG transitions to a high level so that the NMOS transistor ME can become conductive and the high-level output signal TGO can be released through the inverter gate I3 . At the same time, the output signals of the inverter gates I2 and I4 transition to a low level. In response to the address update signal TG going to a low level, the NMOS transistor ME becomes non-conductive and the output signals of the inverter gates I2, I4 transition to a high level. The high-level transition of the output signal of the inverter gate I2 is then transmitted to the node N1 after being delayed by the delay circuit constituted by the timer section 61. Since the delay time set by the timer section 61 is longer than the pulse width of the address update signal TG, the node N1 transitions to a high level after an elapse of the delay time after the low-level transition of the address update signal TG. In response to this, the output signal TGO transitions to a low level.

The equalize signal EQ, which is the output signal of the AND gate A1, goes to a high level when the inverter gates I4, I3 are both at a high level. During the period from the low-level transition of the address update signal TG to the low-level transition of the output signal TGO, a high-level equalize signal EQ is output.

Figure 8:
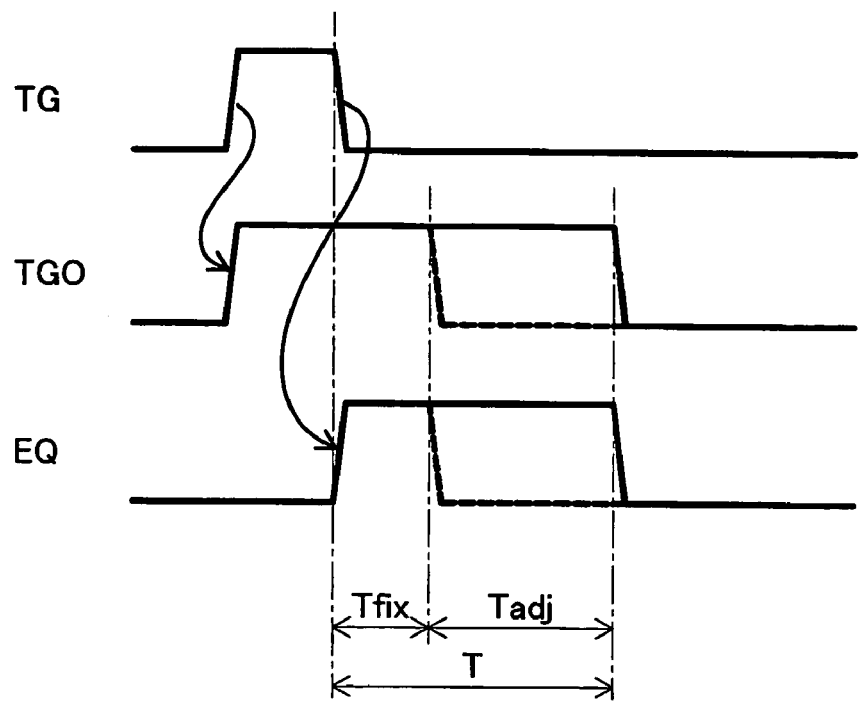
FIG. 8 is an operation waveform chart showing generation of the precharge signal shown in FIG. 6 in accordance with the illustrative embodiment.
Figure 9:
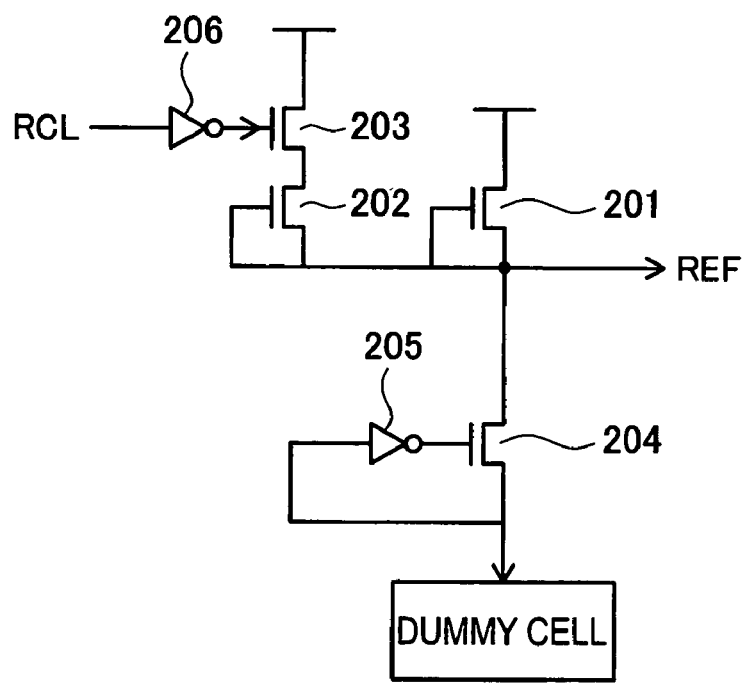
FIG. 9 is a circuit diagram in accordance with a prior art technique.

As shown in FIG. 8, the period of time T between the low-level transition of the address update signal TG and the low level transition of the output signal TGO is a delay time. Of this time period T, a delay time period Tfix from the low-level transition of the address signal TG is a fixed time period timed determined by the resistance element RE and the capacitance element CE. A time period Tadj subsequent to the time period Tfix is an adjustable delay time timed by the resistance element RE and the capacitance elements CE(1) to CE(k). In accordance with the operating condition information D(1) to D(k), the delay time is adjusted and the pulse width of the equalize signal EQ is adjusted.

As is apparent from the foregoing description, in accordance with the illustrative embodiment of the present invention described herein, the load to be applied to the reference data readout path can be arbitrarily adjusted for each of the first and second access operations. Additionally, the time of the precharge operation performed prior to readout of data can be arbitrarily adjusted.

In the first access operation, a data readout operation including selection of memory cells MC by activation of a word line is performed, whereas in the second access operation, data is read out from the selected memory cells. If the propagation time constants of data to be read out in the first and second access operations differ from each other and/or vary respectively, or if the current driving ability of the memory cells and that of the reference cell vary (leading to variations in the discharge time constant after precharging), the time-transitions of the voltage levels of the data input line SAIN and the reference data input line SAINR during readout of data are balanced irrespective of fluctuation factors by arbitrarily adjusting the time constant and/or precharge time for each of the first and second access operations. Therefore, the differential voltage between the data input line SAIN and the reference data input line SAINR can be increased to a sufficient degree at an early stage so that the amplification timing of the sense amplifier circuit 10 can be set ahead. As a result, high-speed readout access operations can be carried out.

The foregoing embodiment is suitably applicable to cases where burst operations are performed as the continuous readout operations in a synchronous memory device. During the first access operation in which a word line is switched to another word line in response to initialization of the column address CADD thereby newly selecting memory cells MC and the second access operation in which column selector switches are sequentially selected in response to sequential switching of the column address CADD, the time constant and/or precharge time of the reference data readout path is arbitrarily adjusted, thereby matching the timing of reading out stored data through a readout access with the timing of reading out the reference data, so that high-speed access operations are enabled.

In a memory device configured to have a plurality of banks as storage units, each bank being capable of individually performing access operations, even if a harsh noise environment is brought about during a continuous readout operation by variations in the supply voltage and ground potential, an interference between signals, or the like, caused by the access operations of other banks, the time constant and/or precharge time can be arbitrarily adjusted, and readout access operations which can withstand a harsh noise environment can be executed.

In a nonvolatile memory device configured to have a plurality of banks, a harsh noise environment may be caused by the power supply because of high voltage and/or a supply of negative voltage when other banks perform a programming operation or erasing operation. In such a situation, the invention can ensure a high-speed continuous readout operation by the arbitral adjustments.

While at least one illustrative embodiment has been presented in the foregoing detailed description of the invention, it is apparent that the invention is not necessarily limited in its applications to the particular embodiment shown herein and various changes and modifications may be made to the disclosed embodiment without departing from the spirit and scope of the invention.

Although FIGS. 6 and 7 are associated with a case where the number and/or combination of capacitance loads to be connected is controlled for adjusting the delay time, the invention is not limited to this. The delay time may be adjusted by controlling the value of the resistance element or the combination of resistance elements to be connected in place of or in addition to those of the capacitance elements.

The supply voltage VCC of the current voltage conversion circuit 8 and the precharge circuit 9 may be replaced with a discretionary voltage (e.g., a stepped-down supply voltage or stepped-up supply voltage generated within the memory device) and the precharge voltage may be arbitrarily set.

In addition, although a synchronous memory device has been explained as an example of the memory device of the illustrative embodiment in accordance with the present invention and the burst operation has been described as the continuous readout operation in the foregoing embodiment, the invention is not limited to this. The invention is similarly applicable to other continuous readout access operations such as the page operation mode of an asynchronous memory device. In addition, although a nonvolatile memory device has been described as an example of the memory device of the invention, the invention is equally applicable to both nonvolatile and volatile memory devices as far as they perform readout accessing of stored data by comparing a memory cell MC and a reference memory cell RC.

It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A memory device which performs a continuous readout operation including a first access operation for performing a data readout operation including selection of at least one memory cell as a readout target and a second access operation for performing data readout operations to continuously read data from the at least one memory cell which has already been selected in the first access operation, the memory device comprising:
   a first storage section storing first load information on the load to be applied to a reference data readout path during the first access operation; and
   a second storage section storing second load information on the load to be applied to the reference data readout path during the second access operation.

2. The memory device in accordance with claim 1, further comprising:
   a plurality of capacitive load switch elements; and
   a plurality of capacitive elements coupled to the plurality of capacitive load switch elements for connection to the reference data readout path therethrough,
   wherein combinations of the capacitive load switch elements to be activated are controlled in accordance with the first and second load information.

3. The memory device in accordance with claim 1, further comprising:
   a plurality of resistive load switch elements; and
   a plurality of resistive elements to be bypassed by the plurality of resistive load switch elements,
   wherein combinations of the resistive load switch elements to be activated are controlled in accordance with the first and second load information.

4. The memory device in accordance with claim 1, further comprising:
   a plurality of capacitive load switch elements;
   a plurality of capacitive elements coupled to the plurality of capacitive load switch elements for connection to the reference data readout path therethrough;
   a plurality of resistive load switch elements; and
   a plurality of resistive elements to be bypassed by the resistive load switch elements,
   wherein combinations of the capacitive load switch elements to be activated and the resistive load switch elements to be activated are controlled in accordance with the first and second load information.

5. The memory device in accordance with claim 1 further comprising an access identifying section for receiving an address signal for selecting the memory cell from which data is read out and for identifying the first access operation and the second access operation in response thereto.

6. The memory device in accordance with claim 5, wherein the access identifying section identifies the memory cell as the readout target by selection of a word line during the first access operation, and the address signal selecting the memory cell connected to the same word line is a column address signal.

7. The memory device in accordance with claim 6, wherein the identification during the first access operation is performed in response to the column address signal.

8. The memory device in accordance with claim 6, wherein the continuous readout operation is a burst operation comprising latency times, and
wherein the first and second storage sections store the first and second load information or the first and second precharge time information at each of the latency times.

9. A memory device which performs a continuous readout operation including a first access operation for performing a data readout operation including selection of at least one memory cell as a readout target and a second access operation for performing data readout operations to continuously read data from the at least one memory cell which has already been selected in the first access operation, the memory device comprising:
a first storage section storing first precharge time information corresponding to a precharge time for a data readout path and a reference data readout path during the first access operation; and
a second storage section storing second precharge time information corresponding to a precharge time for the data readout path and the reference data readout path during the second access operation.

10. The memory device in accordance with claim 9 further comprising:
a timer section which determines the precharge time, the timer section comprising:
a plurality of capacitive load switch elements; and
a plurality of capacitive elements to be connected to the timer section through the capacitive load switch elements,
wherein combinations of the capacitive load switch elements are activated in accordance with the first and second precharge time information.

11. The memory device in accordance with claim 9 further comprising:
a timer section which determines the precharge time, the timer section comprising:
a plurality of resistive load switch elements; and
a plurality of resistive elements to be connected to the timer section through the resistive load switch elements,
wherein combinations of the resistive load switch elements are activated in accordance with the first and second precharge time information.

12. The memory device in accordance with claim 9 further comprising:
a timer section which determines the precharge time, the timer section comprising:
a plurality of capacitive load switch elements;
a plurality of capacitive elements to be connected to the timer section through the capacitive load switch elements;
a plurality of resistive load switch elements; and
a plurality of resistive elements to be connected to the timer section through the resistive load switch elements,
wherein combinations of the capacitive load switch elements and the resistive load switch elements are activated in accordance with the first and second precharge time information.

13. The memory device in accordance with claim 9 further comprising an access identifying section for receiving an address signal for selecting the memory cell from which data is read out and for identifying the first access operation and the second access operation in response thereto.

14. The memory device in accordance with claim 13, wherein the access identifying section identifies the memory cell as the readout target by selection of a word line during the first access operation, and the address signal selecting the memory cell connected to the same word line is a column address signal.

15. The memory device in accordance with claim 14, wherein the identification during the first access operation is performed in response to the column address signal.

16. The memory device in accordance with claim 14, wherein the continuous readout operation is a burst operation comprising latency times, and
wherein the first and second storage sections store the first and second load information or the first and second precharge time information at each of the latency times.

17. A control method for a memory device which performs a continuous readout operation including a first access operation for performing a data readout operation including selecting at least one memory cell as a readout target and a second access operation for performing data readout operations to continuously read data from the at least one memory cell which has already been selected in the first access operation, the method comprising the steps of:
in the first access operation, setting a load to be applied to a reference data readout path based on first load information stored in the memory device; and
in the second access operation, setting a load to be applied to the reference data readout path based on second load information stored in the memory device.

18. The control method for the memory device in accordance with claim 17 further comprising the step of identifying the first and second access operations in response to an address signal which selects the memory cell from which data is read out.

19. A control method for a memory device which performs a continuous readout operation including a first access operation for performing a data readout operation including selecting at least one memory cell as a readout target and a second access operation for performing data readout operation to continuously read data from the at least one memory cell which has already been selected in the first access operation, the method comprising the steps of:
in the first access operation, setting a precharge time for a data readout path and a reference data readout path based on first precharge time information stored in the memory device; and
in the second access operation, setting a precharge time for the data readout path and the reference data readout path based on second precharge information stored in the memory device.

20. The control method for the memory device in accordance with claim 19 further comprising the step of identifying the first and second access operations in response to an address signal which selects the memory cell from which data is read out.

* * * * *